(12) United States Patent
Kwon

(10) Patent No.: US 10,446,591 B2
(45) Date of Patent: Oct. 15, 2019

(54) TRANSISTOR DISPLAY PANEL, MANUFACTURING METHOD THEREOF, AND DISPLAY DEVICE INCLUDING THE SAME

(71) Applicant: Samsung Display Co., Ltd., Yongin-si (KR)

(72) Inventor: Hyuk Soon Kwon, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 15/452,602

(22) Filed: Mar. 7, 2017

(65) Prior Publication Data

US 2017/0294464 A1 Oct. 12, 2017

(30) Foreign Application Priority Data

Apr. 7, 2016 (KR) ........................ 10-2016-0042786

(51) Int. Cl.
| | |
|---|---|
| *H01L 27/12* | (2006.01) |
| *H01L 29/786* | (2006.01) |
| *H01L 27/32* | (2006.01) |
| *G02F 1/1362* | (2006.01) |
| *G02F 1/1343* | (2006.01) |
| *G02F 1/1368* | (2006.01) |

(52) U.S. Cl.
CPC ...... *H01L 27/1288* (2013.01); *G02F 1/13624* (2013.01); *G02F 1/136209* (2013.01); *H01L 27/1225* (2013.01); *H01L 27/1248* (2013.01); *H01L 27/1251* (2013.01); *H01L 27/1255* (2013.01); *H01L 29/7869* (2013.01); *H01L 29/78606* (2013.01); *H01L 29/78633* (2013.01); *G02F 1/1368* (2013.01); *G02F 1/13439* (2013.01); *G02F 2001/136231* (2013.01); *G02F 2201/123* (2013.01); *H01L 27/3262* (2013.01)

(58) Field of Classification Search
None
See application file for complete search history.

(56) References Cited

U.S. PATENT DOCUMENTS

| | | | |
|---|---|---|---|
| 8,975,115 B2 | 3/2015 | Endo et al. | |
| 2007/0195248 A1* | 8/2007 | Huh | G02F 1/13624 349/139 |
| 2011/0294244 A1* | 12/2011 | Hattori et al. | H01L 27/1218 438/34 |
| 2014/0231797 A1 | 8/2014 | Matsuura | |
| 2016/0071891 A1* | 3/2016 | Oh | H01L 27/1248 257/72 |

FOREIGN PATENT DOCUMENTS

| | | |
|---|---|---|
| KR | 10-2014-0078190 | 6/2014 |
| KR | 10-2015-0075512 | 7/2015 |
| KR | 10-2015-0080355 | 7/2015 |

* cited by examiner

*Primary Examiner* — Jay C Chang
(74) *Attorney, Agent, or Firm* — H.C. Park & Associates, PLC

(57) ABSTRACT

A transistor display panel including: a driving voltage line and a first electrode disposed on a substrate; a semiconductor overlapping the first electrode; and an electrode layer overlapping the semiconductor, the electrode layer including a drain electrode, a gate electrode, and a source electrode. The first electrode and the semiconductor are connected through the source electrode.

11 Claims, 10 Drawing Sheets

TRANSISTOR DISPLAY PANEL, MANUFACTURING METHOD THEREOF, AND DISPLAY DEVICE INCLUDING THE SAME

CROSS-REFERENCE TO RELATED APPLICATION

This application claims priority from and the benefit of Korean Patent Application No. 10-2016-0042786, filed on Apr. 7, 2016, which is hereby incorporated by reference for all purposes as if fully set forth herein.

BACKGROUND

Field

Exemplary embodiments relate to a transistor display panel, a method for manufacturing thereof, and a display device including the same.

Discussion of the Background

A transistor included in various electronic devices, such as a display device, includes a gate electrode, a source electrode, a drain electrode, and a semiconductor. The transistor is used as a switching element, a driving element, and the like in the display device.

The semiconductor material used in the transistor is an important factor in determining characteristics of the transistor. The semiconductor typically includes silicon (Si). The silicon is divided into amorphous silicon and polysilicon according to a crystallization type, wherein the amorphous silicon has a simple manufacturing process but has low charge mobility such that there is a limit for manufacturing a high performance thin film transistor, and the polysilicon has high charge mobility but a process of crystallizing the silicon is required such that the manufacturing cost is increased and the process is complicated. Recently, studies regarding a thin film transistor using an oxide semiconductor with a higher on/off ratio and carrier mobility than the amorphous silicon, and lower cost and higher uniformity than polycrystalline silicon, have progressed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments are directed to improving characteristics of a transistor, and reducing a number of masks and process steps in a method for manufacturing a transistor display panel.

Additional aspects will be set forth in the detailed description which follows, and, in part, will be apparent from the disclosure, or may be learned by practice of the inventive concept.

An exemplary embodiment discloses a transistor display panel including: a driving voltage line and a first electrode disposed on a substrate; a semiconductor disposed on the substrate and overlapping the first electrode; and an electrode layer overlapping the semiconductor, the electrode layer including a drain electrode, a gate electrode, and a source electrode, and the first electrode and the semiconductor may be connected through the source electrode.

The semiconductor includes a drain region, a channel, and a source region, and the drain region and the driving voltage line may be connected through the drain electrode.

The source region and the first electrode may be connected through the source electrode.

The drain electrode, the gate electrode, and the source electrode may be disposed in the same layer.

The first electrode and the driving voltage line may be disposed in the same layer.

The transistor display panel may further include a first insulating layer covering the driving voltage line and the first electrode, and a second insulating layer covering the semiconductor, wherein the first insulating layer and the second insulating layer may include a first contact hole connecting the first electrode and the source electrode and a second contact hole connecting the driving voltage line and the drain electrode, and the second insulating layer may include a third contact hole connecting the source region and the source electrode and a fourth contact hole connecting the drain region and the drain electrode.

The second insulating layer may be disposed on an entire surface of the substrate.

An exemplary embodiment also discloses a display device including: a driving voltage line and a first electrode disposed on a substrate; a semiconductor disposed on the substrate and overlapping the first electrode; an electrode layer overlapping the semiconductor, and including a drain electrode, a gate electrode, and a source electrode, and a pixel electrode disposed on the electrode layer. The first electrode and the semiconductor may be connected through the source electrode, and each of the pixel electrode and the first electrode may be connected with the semiconductor through the source electrode.

The display device may further include a first capacitor electrode disposed on the substrate, and a second capacitor electrode disposed on the first capacitor electrode. The first capacitor electrode may be integrally connected with the first electrode, and the second capacitor electrode may be integrally connected with the gate electrode.

The semiconductor includes a drain region, a channel, and a source region, the drain region and the driving voltage line may be connected through the drain electrode, and the source region and the first electrode may be connected through the source electrode.

The display device may further include a first insulating layer covering the driving voltage line and the first electrode, and a second insulating layer covering the semiconductor. The first insulating layer and the second insulating layer may include a first contact hole connecting the first electrode and the source electrode and a second contact hole connecting the driving voltage line and the drain electrode, and the second insulating layer may include a third contact hole connecting the source region and the source electrode and a fourth contact hole connecting the drain region and the drain electrode.

An exemplary embodiment also discloses a method for manufacturing a transistor display panel including: depositing a first conductive material on a substrate and patterning the first conductive material to form a driving voltage line and a first electrode; forming a semiconductor on the substrate having the driving voltage line and the first electrode; and depositing a second conductive material on the substrate having the semiconductor and patterning the second conductive material to simultaneously form a drain electrode, a gate electrode, and a source electrode.

The method may further include forming a first insulating layer on the substrate having the driving voltage line and the first electrode, forming a second insulating layer on the substrate having the semiconductor, and etching the first insulating layer and the second insulating layer to form a first contact hole exposing the first electrode and a second contact hole exposing the driving voltage line.

The method may further include etching the second insulating layer to form a third contact hole and a fourth contact hole exposing the semiconductor.

The transistor display panel according to the inventive concepts can improve various performance characteristics of the transistor, such as an output saturation characteristic. Further, according to a process for manufacturing the transistor display panel of an exemplary embodiment, the numbers of masks used and process steps can be reduced, thereby reducing the manufacturing cost.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
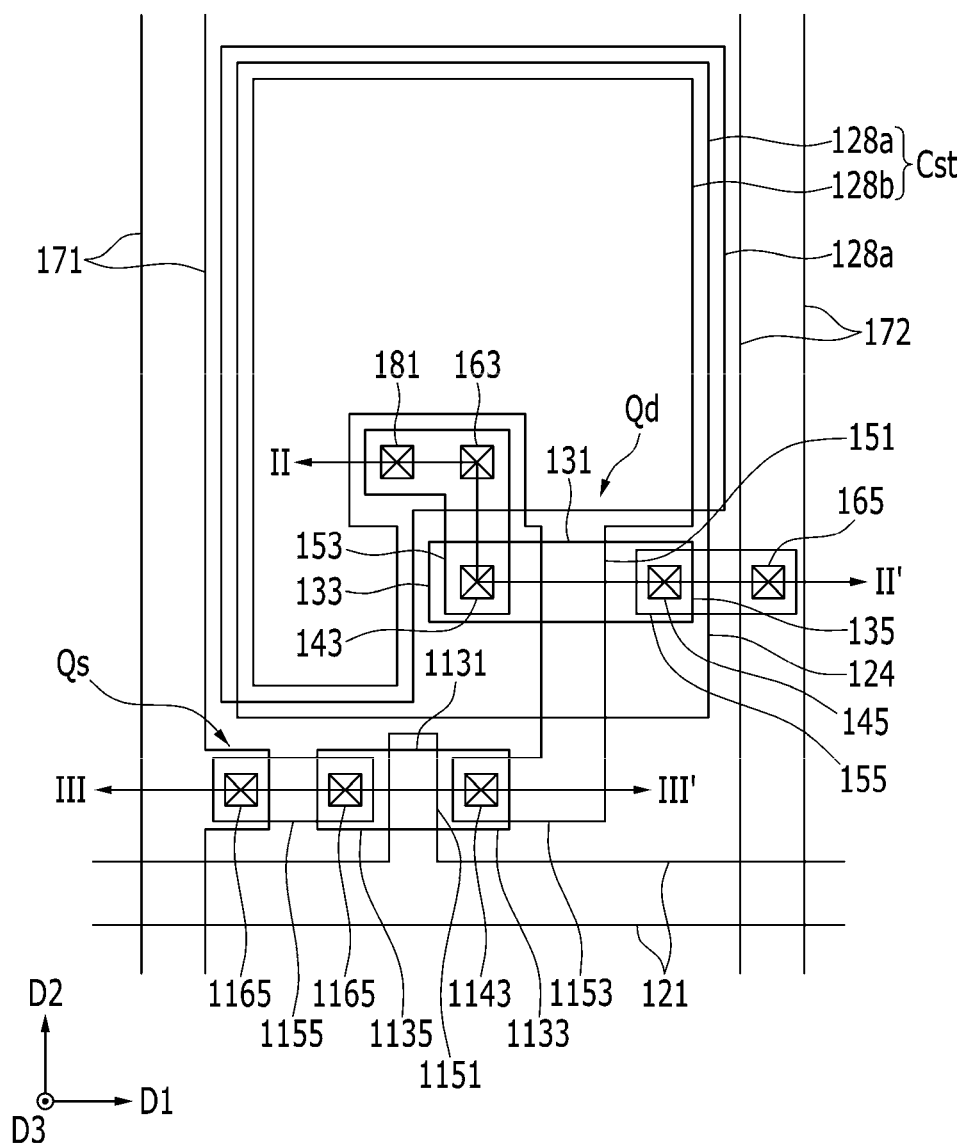
FIG. 1 is a top plan view of a transistor display panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A transistor display panel according to an exemplary embodiment will be described with reference to FIG. 1 and FIG. 2.

Figure 2A:
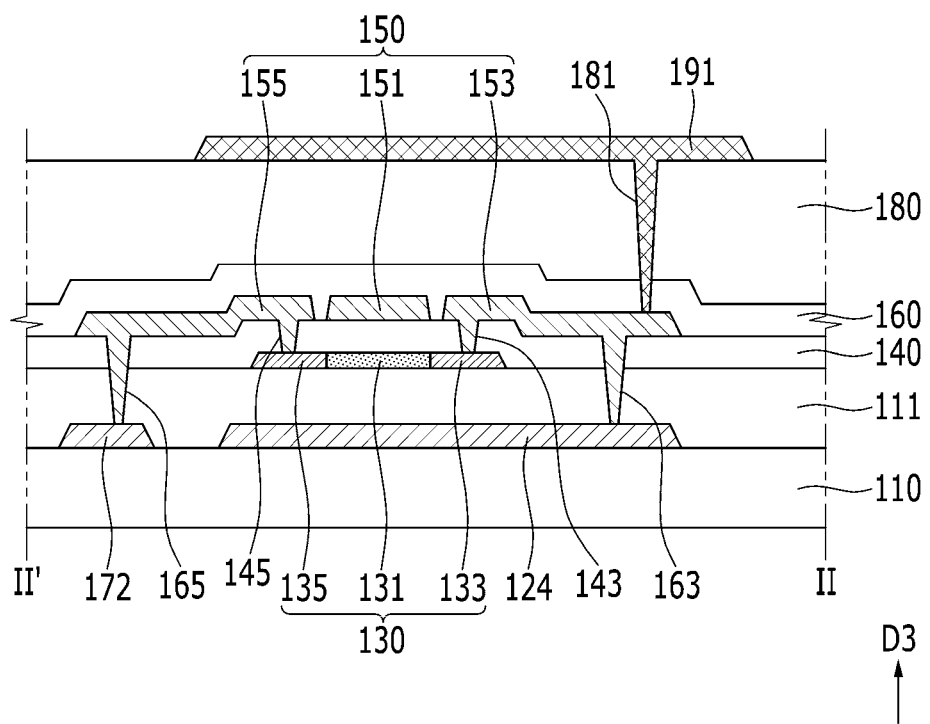
FIG. 2A is a cross-sectional view taken along line II-II' of FIG. 1.
Figure 2B:
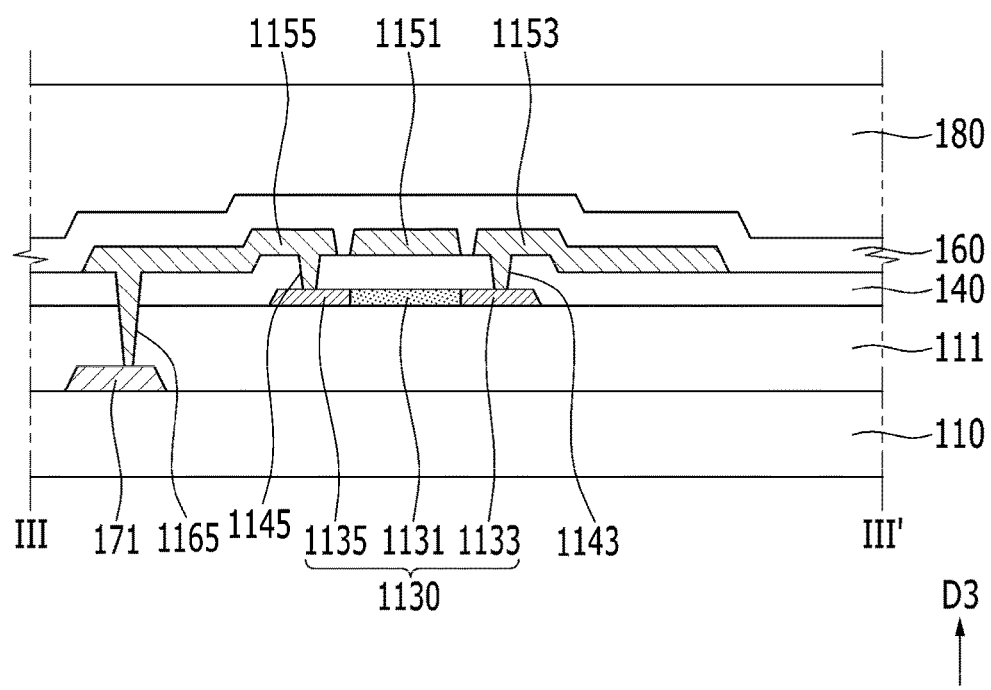
FIG. 2B is a cross-sectional view taken along line III-III' of FIG. 1.

FIG. 1 is a top plan view of a transistor display panel according to an exemplary embodiment, FIG. 2A is a cross-sectional view taken along line II-II' of FIG. 1, and FIG. 2B is a cross-sectional view taken along line III-III' of FIG. 1.

Referring to FIG. 1, FIG. 2A, and FIG. 2B, a transistor display panel according to an exemplary embodiment includes a substrate 110, and a plurality of transistor Qs and Qd positioned on the substrate 110

The transistors Qs and Qd may be transistors of the display device. For example, when the display device is an organic light emitting diode display, the transistors may be a driving transistor Qd and a switching transistor Qs positioned in a pixel area.

In the drawings, a first direction D1 and a second direction D2 are perpendicular to each other, and are parallel to a horizontal section of the substrate 110. A structure shown when observing the surface formed by the first direction D1 and the second direction D2 is referred to as a plane structure.

Further, a third direction D3 is perpendicular to the first and second directions D1 and D2 and is parallel to a vertical section of the substrate 110. The third direction D3 may be mainly represented in the cross-sectional structure, and is referred to as a cross-sectional direction. In the cross-sectional structure, if a constituent element is positioned on any other constituent element, it means that two constituent elements are arranged in the third direction D3, and other constituent elements may be positioned between the two constituent elements.

Referring to FIG. 2A, the driving transistor Qd includes a driving voltage line 172 and a first electrode 124 positioned on the substrate 110, a first insulating layer 111 covering the driving voltage line 172 and the first electrode 124, a semiconductor 130 positioned on the first insulating layer 111, a second insulation layer 140 positioned on the semiconductor 130, and an electrode layer 150 positioned on the second insulating layer 140.

The substrate 110 may be a substrate including an organic material, an inorganic material, glass, or a metal such as stainless steel.

On the substrate 110, a driving voltage line 172 for transferring a driving signal and a first electrode 124 are spaced apart from each other by a predetermined interval. In this case, the first electrode 124 is positioned to overlap the semiconductor 130 described below. Accordingly, the first electrode 124 can serve as a light blocking film. That is, the first electrode 124 prevents external light from reaching the semiconductor 130, thereby preventing deterioration of the characteristics of the semiconductor 130 and controlling a leakage current of the transistor.

Further, the driving voltage line 172 and the first electrode 124 may be formed with a conductive material such as a metal, and may be formed as a single layer or as multiple layers (multilayer).

The driving voltage line 172 and the first electrode 124 are positioned at the same layer. As described, according to this disclosure, since the driving voltage line 172 and the first electrode 124 are positioned at the same layer, they can be simultaneously formed by the same process, so that the manufacturing process can be simplified.

Next, the first insulating layer 111 covering the driving voltage line 172 and the first electrode 124 is positioned on the substrate 110.

The first insulation layer 111 functions to protect the semiconductor 130 and improve the characteristics of the semiconductor 130 by preventing permeation of an impurity to the semiconductor 130 from the substrate 110. Accordingly, the first insulating layer 111 may be referred to as a "buffer layer".

In this case, the first insulating layer 111, for example, may have a thickness of about 3000 Å to about 5000 Å.

The first insulating layer 111, for example, may include an inorganic insulation material such as a silicon oxide ($SiO_x$), a silicon nitride ($SiN_x$), aluminum oxide ($Al_2O_3$), hafnium oxide ($HfO_3$), yttrium oxide ($Y_2O_3$), and the like.

In addition, the first insulation layer 111 may be formed as a single layer or as multiple layers (multilayer). In further detail, when the first insulation layer 111 is formed as a double layer, a lower layer may include a silicon nitride ($SiN_x$) and an upper layer may include a silicon oxide ($SiO_x$).

The semiconductor 130 overlapping the first electrode 124 is positioned on the first insulating layer 111. The semiconductor 130 includes a channel 131 overlapping a gate electrode 151, and a source region 133 and a drain region 135 positioned at respective sides of the channel 131.

When a gate-on voltage is applied to the gate electrode 124, the source region 133 and the drain region 135 may be determined depending on a direction of carriers that flow through the channel 131, and the carriers flow to the drain electrode 135 from the source region 133. Thus, when the transistor TR operates, electrons flow to the drain region 135 from the source region 133 in an n-type transistor, and holes flow to the drain region 135 from the source region 133 in a p-type transistor.

In this case, the source region 133 may be electrically connected with the pixel electrode 191 and the first electrode 124 of the display device through a source electrode 153. Further, the drain region 135 may be electrically connected with the driving voltage line 172 through a drain electrode 155.

The channel 131, the source region 133, and the drain region 135 may include the same material. For example, the channel 131, the source region 133, and the drain region 135 may respectively include the same oxide. Such a metallic oxide may exemplarily include an oxide of a metal such as zinc (Zn), indium (In), gallium (Ga), tin (Sn), titanium (Ti), and the like, or a combination of a metal such as zinc (Zn), indium (In), gallium (Ga), tin (Sn), titanium (Ti), and the like, and an oxide thereof. In further detail, the oxide may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). Further, the channel 131, the source region 133, and the drain region 135 may include a semiconductor material, such as polysilicon.

A carrier concentration of the source region 133 and the drain region 135, which are conductors, is different from that of the channel 131. For example, when the carrier concentration of the channel 131 is, for example, $10^{18}/cm^3$ or less, the carrier concentration of the source region 133 and the drain region 135 may be $10^{18}/cm^3$ or more. In addition, a gradient where the carrier concentration is gradually changed may be formed at a boundary between the source region 133 and the channel 131 or a boundary between the drain region 135 and the channel 131.

Further, the source region 133 and the drain region 135 may include a material that is reduced from an oxide semiconductor included in the semiconductor 130. For example, the source region 133 and the drain region 135 may further include at least one of fluorine (F), hydrogen (H), and sulfur (S) in addition to the oxide semiconductor included in the semiconductor 130. At least one of fluorine (F), hydrogen (H), and sulfur (S) included in the source region 133 and the drain region 135 may have a concentration of $10^{15}/cm^3$ or more. A gradient where a concentration of at least one of fluorine (F), hydrogen (H), and sulfur (S) is gradually changed may exist at a boundary between the source region 133 and the channel 131 or a boundary between the drain region 135 and the channel 131. The source region 133 and the drain region 135 may be formed by making the oxide semiconductor that forms the semiconductor 130 conductive using plasma treatment and the like. For example, the oxide semiconductor may be made conductive by plasma-treating the oxide semiconductor under a hydrogen gas atmosphere and dispersing hydrogen into the oxide semiconductor such that the source region 133 and the drain region 135 can be formed.

Next, the second insulating layer 140 is positioned on the semiconductor 130. The second insulation layer 140 may be a single layer or multiple layers (multilayer). When the second insulation layer 140 is formed as a single layer, the second insulation layer 140 may include an insulation material such as a silicon oxide ($SiO_x$), a silicon nitride ($SiN_x$), a silicon oxynitride (SiON), aluminum oxide ($Al_2O_3$), hafnium oxide ($HfO_3$), yttrium oxide ($Y_2O_3$), and the like. Further, when the second insulation layer 140 is formed as a multilayer, a lower layer that contacts the semiconductor 130 may include an insulation oxide such as a silicon oxide ($SiO_x$), aluminum oxide ($Al_2O_3$), hafnium oxide ($HfO_3$), yttrium oxide ($Y_2O_3$), and the like to improve an interface property of the semiconductor 130 and prevent permeation of an impurity into the semiconductor 130, and at least one layer that is formed above the semiconductor 130 may include various insulation materials such as a silicon oxide ($SiO_x$) and a silicon nitride ($SiN_x$).

The second insulating layer 140 may be formed to have a thickness less than the first insulating layer 111. That is, the second insulating layer 140, for example, may have a thickness of about 500 Å to about 1500 Å.

Further, in this exemplary embodiment, the second insulating layer 140 may be formed on the entire surface of the substrate 110, and the second insulating layer 140 may be referred to as a "gate insulation layer". If the second insulating layer 140 is formed only on the portion corresponding to the gate electrode 151, the transistor may be damaged due to a short circuit occurring between the gate electrode 151 and the semiconductor 130. Accordingly, the second insulating layer 140 may be formed on the entire surface of the substrate 110.

The first insulating layer 111 and the second insulating layer 140 may include a first contact hole 163 connecting the first electrode 124 and the source electrode 153, and a second contact hole 165 connecting the driving voltage line 172 and the drain electrode 155.

Further, the second insulating layer 140 may include a third contact hole 143 connecting the source region 133 and the source electrode 153, and a fourth contact hole 145 connecting the drain region 135 and the drain electrode 155.

Next, the electrode layer 150 including the drain electrode 155, the gate electrode 151, and the source electrode 153 is positioned on the second insulating layer 140. The drain electrode 155, the gate electrode 151, and the source electrode 153 are spaced apart from each other at the same layer, and the drain electrode 155 and the source electrode 153 are positioned at opposite sides of the gate electrode 151.

As described above, according to this exemplary embodiment, since the drain electrode 155, the gate electrode 151, and the source electrode 153 are positioned at the same layer, no additional insulating film formation and contact hole formation steps are required to form them, and the number of process steps and the number of masks required can be reduced. In addition, in comparison with the case where the drain electrode 155, the source electrode 153, and the gate electrode 151 are positioned at different layers, it is possible to prevent damage of the semiconductor due to etching since the etching depth in the step of forming the contact hole for electrically connecting the drain electrode 155 and the source electrode 153 to the semiconductor can be significantly reduced.

In the transistor display panel according to this exemplary embodiment, the first electrode 124 and the semiconductor 130 are electrically connected through the source electrode 153. In further detail, the first electrode 124 is connected with the source electrode 153 through the first contact hole 163, and the source electrode 153 is connected with the source region 133 through the third contact hole 143.

Further, the driving voltage line 172 is connected with the drain electrode 155 through the second contact hole 165, and the drain electrode 155 is connected with the drain region 135 through the fourth contact hole 145.

The first electrode 124 may receive a bias rather than being electrically connected to the source region 133. Thus, when a fixed bias is applied to the semiconductor 130, the output saturation characteristic of the transistor can be improved, and for example, the output current of the transistor can be less affected by a source voltage or a drain voltage in the saturation area of the transistor. Further, the first electrode 124 may be in an electrically floated state rather than being electrically connected to the source region 133 or receiving a bias.

In addition, the drain electrode 155, the gate electrode 151, and the source electrode 153 may be formed as a single conductive layer, or may be formed as multiple layers (multilayer) that includes at least two conductive layers, each made of a different material.

In this case, the semiconductor 130 overlaps the gate electrode 151, interposing the second insulation layer 140 therebetween. Accordingly, the second insulation layer 140 may cover most of the semiconductor 130. Further, the channel region 131 may overlap most of the gate electrode 151 in the third direction D3, and the source region 133 and the drain region 135 may not overlap most of the gate electrode 151 in the third direction D3.

Next, an interlayer insulation layer 160 is positioned on the electrode layer 150. The interlayer insulation layer 160 may be a single layer or a multilayer. When the interlayer insulation layer 160 is formed as a single layer, the interlayer insulation layer 160 may include an inorganic insulation material, such as a silicon oxide ($SiO_x$), a silicon nitride ($SiN_x$), a silicon oxynitride (SiON), a silicon oxyfluoride (SiOF), and the like. Specifically, the interlayer insulation layer 160 may include at least one of a silicon nitride ($SiN_x$) and a silicon oxynitride (SiON) to reduce resistance of the source region 133 and the drain region 135 by injecting hydrogen (H) therein.

When the interlayer insulation layer 160 is formed as a multilayer, the lowest layer may include at least one of a silicon nitride ($SiN_x$) and a silicon oxynitride (SiON) that are capable of introducing hydrogen (H) into the source region 133 and the drain region 135, and a middle layer or an upper layer that includes, for example, a silicon oxide ($SiO_x$), may be formed on the lowest layer. In addition, when the interlayer insulation layer 160 is formed as a multilayer, another layer that includes a material such as a silicon nitride ($SiN_x$) or a silicon oxynitride (SiON) may be further formed on the middle layer that includes a silicon oxide ($SiO_x$).

Next, a passivation layer 180 may be positioned on the interlayer insulation layer 160. The passivation layer 180 may include at least one of an inorganic insulation material and an organic insulation material, and may be formed as a single layer or multiple layers (multilayer). In this case, the passivation layer 180 may have a substantially flat upper surface.

The interlayer insulation layer 160 and the passivation layer 180 include a pixel contact hole 181 exposing the source electrode 153.

Further, a pixel electrode 191 is positioned on the passivation layer 180. The pixel electrode 191 may include a transparent conductive material, such as indium tin oxide (ITO), indium zinc oxide (IZO), and the like.

In this case, the pixel electrode 191 is electrically connected with the source electrode 173 through the pixel contact hole 181, and thus, may receive, for example, a data voltage. Consequently, in this exemplary embodiment, each of the pixel electrode 191 and first electrode 124 is electrically connected with the source region 133 through the source electrode 153.

Next, referring to FIG. 2B, the switching transistor Qs includes a data line 171 positioned on the substrate 110, a first insulating layer 111 covering the data line 171, a semiconductor 1130 positioned on the first insulating layer 111, a second insulation layer 140 covering the semiconductor 1130, and a drain electrode 1155, a gate electrode 1151, and a source electrode 1153 positioned on the second insulation layer 140.

The data line 171 transmits the data signal, and may be positioned at the same layer as the driving voltage line 172 and the first electrode 124 of the driving transistor Qd, as described above. Accordingly, the data line 171 may include the same material as the driving voltage line 172 and the first electrode 124.

The drain electrode 1155 is connected with the data line 171 through a contact hole 1165, a drain region 1135 is connected with the drain electrode 1155 through a contact hole 1145, and a source region 1133 is connected with the source electrode 1153 through a contact hole 1143.

A description regarding the substrate 110, the first insulating layer 111, and the second insulation layer 140 is the same as the description of the above-described constituent elements, and thus, is omitted.

The semiconductor 1130, the drain electrode 1155, the gate electrode 1151, and the source electrode 1153 of the switching transistor Qs may have the same structure and material as the above-described semiconductor 130, drain electrode 155, gate electrode 151, and source electrode 153 of the driving transistor Qd, and thus, the description thereof is omitted.

Referring to FIG. 2A and FIG. 1, the gate electrode 151 of the driving transistor Qd is connected with the source electrode 1153 of the switching transistor Qs, and thus, may be supplied with a gate signal. Further, the gate electrode 1151 of the switching transistor Qs is electrically connected with a gate line 121, and thus, may be supplied with the gate signal. In this case, the gate line 121 extends in a direction crossing the data line 171.

According to an exemplary embodiment, the first electrode 124 of the transistor is electrically connected with the source region 133 via the source electrode 153. Accordingly, a source voltage, which is a voltage of the source region 133, may be applied to the first electrode 124. As described, when the source voltage is applied to the first electrode 124, a current change rate (i.e., a current slope) in a saturation area is decreased in a voltage-current characteristic graph so that an output saturation characteristic of the transistor can be improved. When the transistor has a superior output saturation characteristic, the transistor TR becomes more insensitive to undesirable voltage fluctuations of the source region 133 caused by deterioration of various connected elements, such as an emission element connected to the transistor, for example, such that an output current of the transistor TR can be less affected. Thus, the transistor according to the present exemplary embodiment can be advantageous as a driving transistor of a display device such as an organic light emission display, and may also be advantageous for forming an external current sensing circuit.

In addition, as described above, because the second insulation layer 140 is positioned on the entire surface of the substrate 110, it is possible to prevent the mobility from being reduced due to an electric field induced between the gate electrode 151 and the semiconductor 130, thereby improving the stability of the transistor.

Although in this exemplary embodiment the driving transistor Qd has the cross-sectional structure shown in FIG. 2A and the switching transistor Qs has the cross-sectional structure of FIG. 2B, the cross-sectional structures of the transistors are not limited thereto, and the switching transistor Qs may also have the cross-sectional structure including the first electrode 124, as shown FIG. 2A.

While the above-described FIG. 2A and FIG. 2B are cross-sectional views of a portion of the transistor display panel shown in FIG. 1, a plane structure of the transistor display panel having a cross-sectional structure like in FIG. 2A and FIG. 2B is not limited to that of FIG. 1. FIG. 1 shows a part of the transistor display panel of an organic light emitting diode display including a driving transistor Qd and a switching transistor Qs. However, an exemplary embodiment is not limited to the organic light emitting diode display, and may be applied to various display devices such as a liquid crystal display.

Next, a method for manufacturing of the transistor display panel having the cross-sectional structure shown in FIG. 2A according to an exemplary embodiment will be described with reference to FIG. 3 to FIG. 8.

FIG. 3 to FIG. 8 are cross-sectional views showing a method for manufacturing of a transistor display panel according to an exemplary embodiment.

Figure 3:
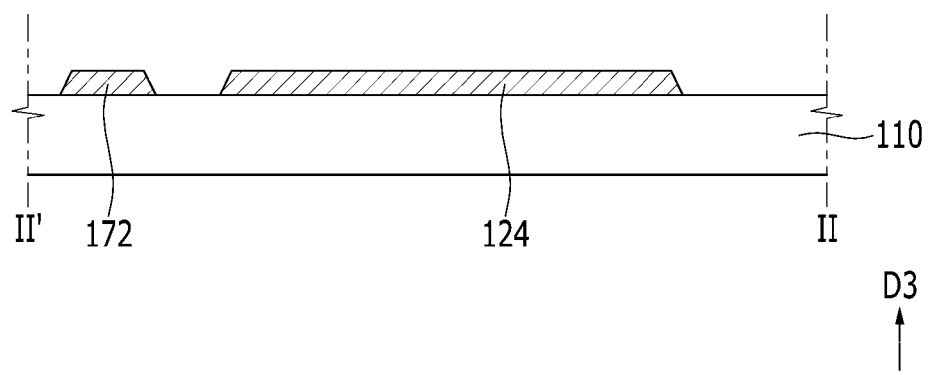
FIG. 3, FIG. 4, FIG. 5, FIG. 6, FIG. 7, and FIG. 8 are cross-sectional views showing a method for manufacturing of a transistor display panel according to an exemplary embodiment.

First, referring to FIG. 3, a first conductive material, such as a metal, is deposited on the substrate 110, and then patterned so that the driving voltage line 172 and the first electrode 124 are formed.

In this case, the first conductive material may be deposited by sputtering and the like, and patterned by using a photosensitive material such as a photoresist and a mask.

When the transistor is a transistor for a liquid crystal display (LCD), a first capacitor electrode 128a and the data line 171 of the switching transistor Qs, which are integrally connected to the first electrode 124 of the driving transistor Qd, may be simultaneously formed by this process.

Figure 4:
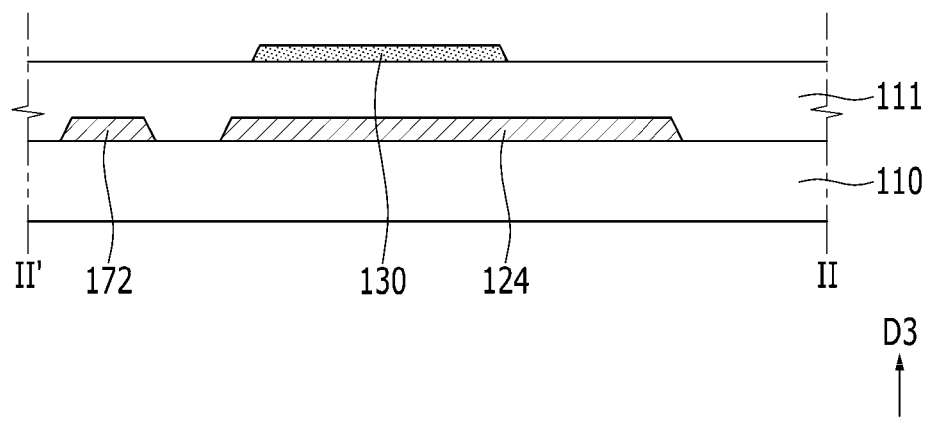

Next, referring to FIG. 4, an inorganic material is deposited on the substrate 110 having the driving voltage line 172 and the first electrode 124 to form the first insulating layer 111, and then the semiconductor 130 is formed thereon.

In this case, as the inorganic material, for example, a silicon oxide ($SiO_x$), a silicon nitride ($SiN_x$), aluminum oxide ($Al_2O_3$), hafnium oxide ($HfO_3$), yttrium oxide ($Y_2O_3$), and the like may be used, and the first insulating layer 111 may be deposited by chemical vapor deposition (CVD).

Further, a semiconductor material, such as zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), and the like, is deposited on the first insulation layer 111 using chemical vapor deposition and then patterned using a second mask such that the semiconductor 130 is formed.

Figure 5:
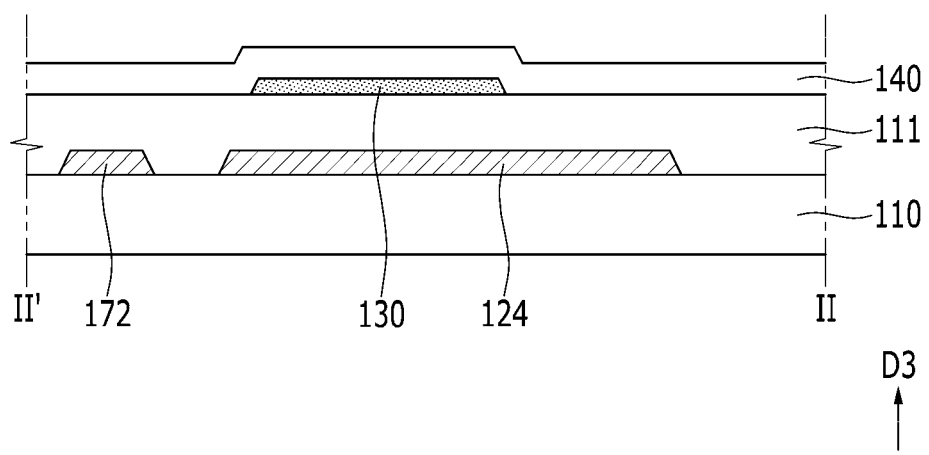

Next, referring to FIG. 5, inorganic insulating material is deposited on the substrate 110 having the semiconductor 130 to form the second insulating layer 140. In this case, as the inorganic material, for example, the above-described insulating material may be used, and the second insulating layer 140 may be deposited by chemical vapor deposition (CVD).

Figure 6:
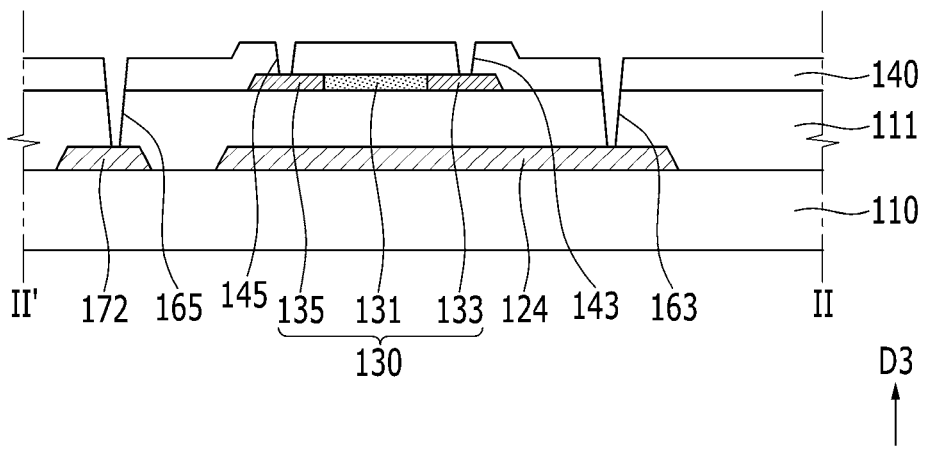

Referring to FIG. 6, the first insulating layer 111 and the second insulation layer 140 are then etched to form the first contact hole 163 and the second contact hole 165, the second insulation layer 140 is etched to form the third contact hole 143 and the fourth contact hole 145, and then the source region 133, the drain region 135, and the channel 131 may be formed.

In this case, the first to fourth contact holes 163, 165, 143, and 145 may be simultaneously formed, or the first contact hole 163 and the second contact hole 165 may be formed first after the first insulating layer 111 is formed, and then the second insulating layer 140 may be formed thereon and the third contact hole 143 and the fourth contact hole 145 may be formed, but the inventive concept is not limited thereto. Further, the first to fourth contact holes 163, 165, 143, and 145 may be formed by at least one of wet etching and dry etching.

In this case, according to this exemplary embodiment, the source region 133 and the drain region 135 may be connected by etching only the third contact hole 143 and fourth contact hole 145, and thus, excessive etching of the semiconductor 130 can be prevented. Accordingly, operating characteristics of the transistor can be improved.

Hydrogen is dispersed to the semiconductor 130 through the third contact hole 143 and the fourth contact hole 145 by performing a plasma treatment in a hydrogen gas atmosphere to make the source region 133 and the drain region 135 conductive, and an area not being conductive by being blocked by the upper electrode 125 may be formed as the channel 131.

Figure 7:
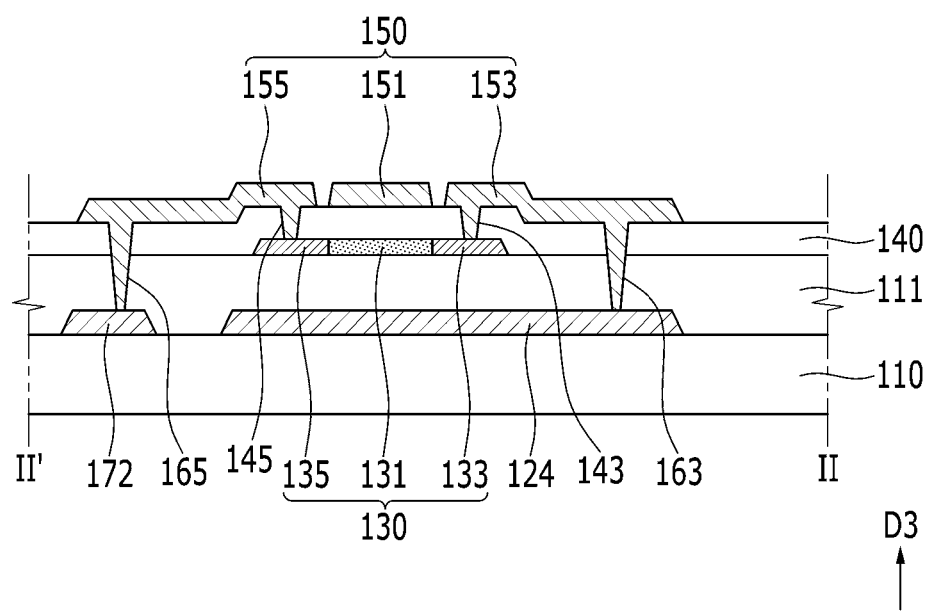

Next, referring to FIG. 7, the second conductive material is deposited on the second insulating layer 140, and then patterned so that the electrode layer 150 including the drain electrode 155, the gate electrode 151, and the source electrode 153 is formed.

As the second conductive material, for example, a metal such as copper (Cu), aluminum (Al), silver (Ag), molybdenum (Mo), chromium (Cr), tantalum (Ta), titanium (Ti), and the like, or a metal alloy thereof, may be used, but the inventive concept is not limited thereto.

In this case, the second conductive material may be deposited by sputtering. The second conductive material may be patterned by depositing a photosensitive material on the second conductive material and dry etching or dry etching with a mask.

As described, according to the method for manufacturing of the transistor display panel of this disclosure, the drain electrode 155, the gate electrode 151, and the source electrode 153 may be simultaneously formed by a single process.

When the transistor is a driving transistor Qd for a liquid crystal display (LCD), a second capacitor electrode 128b, which is integrally connected to the gate electrode 151, may be simultaneously formed by this process.

Figure 8:
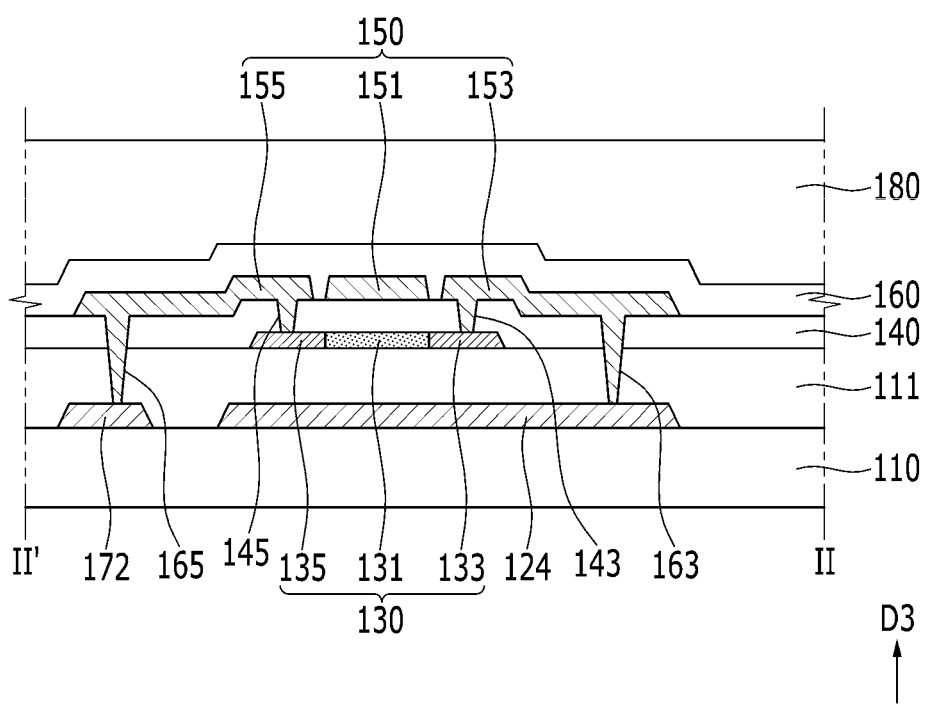

Next, referring to FIG. 8, the interlayer insulation layer 160 and the passivation layer 180 covering the electrode layer 150 are sequentially formed by chemical vapor deposition and the like. In this case, as a material for the interlayer insulation layer 160, for example, an inorganic insulating material such as a silicon oxide ($SiO_x$), a silicon nitride ($SiN_x$), a silicon oxynitride (SiON), and a silicon oxyfluoride (SiOF) may be used, and as a material for the passivation layer 180, for example, an organic insulating material such as a polyacrylate resin, an epoxy resin, a phenolic resin, a polyamide resin, a polyimide resin, an unsaturated polyester resin, a polyphenylene ether resin, a polyphenylene sulfide resin, or benzocyclobutene (BCB) may be used, but the inventive concept is not limited thereto.

Subsequently, the pixel contact hole 181 is formed by etching the interlayer insulation layer 160 and the passivation layer 180, and the pixel electrode 191 is formed on the pixel contact hole 181, such that the transistor display panel having the cross-sectional structure as shown FIG. 2A may be formed.

As described above, according to the method for manufacturing of the transistor display panel of this exemplary embodiment, since the drain electrode 155, the gate electrode 151, and the source electrode 153 are simultaneously formed, the forming step and the etching step for additional forming the insulating film having a thickness of about 5000 Å or more can be omitted, as compared with the conventional method in which the drain electrode 155 and the source electrode 153 are formed in layers different from that of the gate electrode 151.

Accordingly, according to the method for manufacturing of the transistor display panel of this exemplary embodiment, the manufacturing process can be simplified and the number of masks required can be reduced, so that the productivity can be effectively improved.

Next, display devices including the transistor display panel according to an exemplary embodiment of this disclosure will be described with reference to FIG. 9 to FIG. 11.

Figure 9:
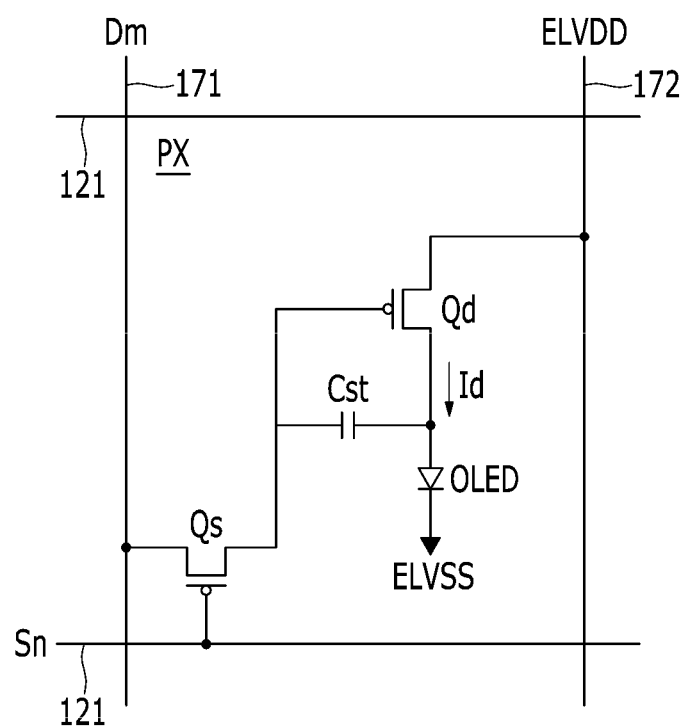
FIG. 9 is an equivalent circuit diagram of one pixel of a display device according to an exemplary embodiment.
Figure 10:
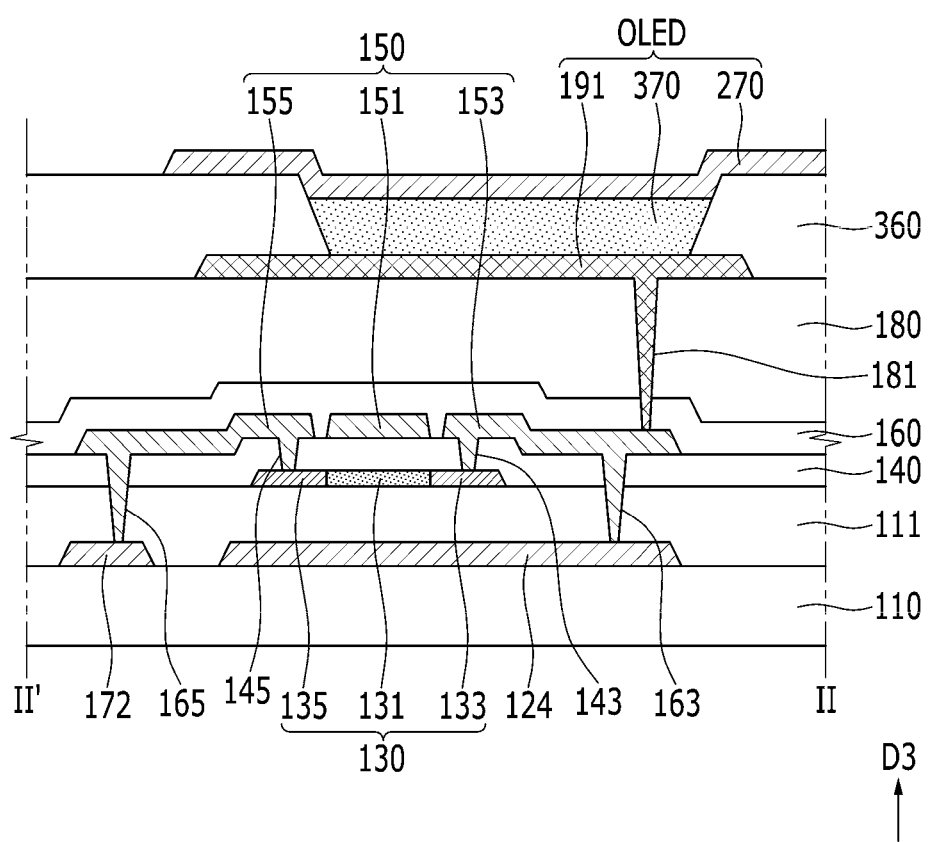
FIG. 10 is a cross-sectional view of a display device according to an exemplary embodiment.

FIG. 9 is an equivalent circuit diagram of one pixel of a display device according to an exemplary embodiment, and FIG. 10 is a cross-sectional view of a display device according to an exemplary embodiment.

In this case, the display device is an organic light emitting diode display, and may include the transistor according to the above-described exemplary embodiment. Accordingly, the same description regarding to the above-described constituent elements will be omitted.

Referring to FIG. 9 along with FIG. 1, one pixel PX of the display device that includes the transistor display panel according to the exemplary embodiment includes a plurality of signal lines 121, 171, and 172, a plurality of transistors Qs and Qd that are connected with the plurality of signal lines 121, 171, and 172, and an organic light emitting diode OLED.

The transistors Qs and Qd include a switching transistor Qs and a driving transistor Qd.

The signal lines 121, 171, and 172 include a plurality of gate lines 121 that transmit a gate signal Sn, a plurality of data lines 171 that transmit a data signal Dm, and a plurality of driving voltage lines 172 that transmit a driving voltage ELVDD.

The gate lines 121 extend in the first direction D1 and are substantially parallel to each other, and the data lines 171 extend in the second direction D2 and are substantially parallel to each other. Although the driving voltage line 172 is shown extending in the second direction D2, the driving voltage line 172 may extend in the first direction D1 or the second direction D2, or may have a web shape including a portion extending in the first direction D1 and a portion extending in the second direction D2.

Although not shown in the figures, one pixel PX may further include a thin film transistor and a capacitor in order to compensate a current applied to the organic light emitting element.

The switching transistor Qs includes a control terminal, an input terminal, and an output terminal. The control terminal is connected to the gate line 121, the input terminal is connected to the data line 171, and the output terminal is connected to the driving transistor Qd. The switching transistor Qs transmits the data signal Dm applied to the data line 171 to the driving transistor Qd in response to the gate signal Sn applied to the gate line 121.

The driving transistor Qd also includes a control terminal, an input terminal, and an output terminal. The control terminal is connected to the switching transistor Qs as the output terminal of the switching transistor Qs, the input terminal is connected to the driving voltage line 172, and the output terminal is connected to the organic light emitting diode OLED. The driving transistor Qd outputs an output current Id, the magnitude of which varies according to a voltage applied between the control terminal and the output terminal.

The storage capacitor Cst is connected between the control terminal and the input terminal of the driving thin film transistor Qd. In this case, the storage capacitor Cst charges a data signal applied to the control terminal of the driving thin film transistor Qd, and maintains the charge of the data signal even after the switching thin film transistor Qs is turned off.

The storage capacitor Cst includes the first capacitor electrode 128a and the second capacitor electrode 128b, as shown in FIG. 1. Particularly, the first capacitor electrode 128a is positioned at the same layer as the first electrode 124 and is integrally connected to the first electrode 124. Further, the second capacitor electrode 128b is positioned at the same layer as the gate electrode 151 and is integrally connected to the gate electrode 151.

The organic light emitting diode OLED includes an anode connected to the output terminal of the driving thin film transistor Qd and a cathode connected to a common voltage ELVSS. The organic light emitting diode OLED displays an image by emitting light, the magnitude of which varies depending on a current of the driving thin film transistor Qd.

The organic light emitting diode OLED may include an organic material that uniquely emits one or more of primary colors such as red, green, and blue, and the organic light emitting device displays a desired image with a spatial sum of these colors.

The switching thin film transistor Qs and the driving thin film transistor Qd may be n-channel field effect transistors (FET) or p-channel field effect transistors. Further, a connection relationship between the switching and driving thin film transistors Qs and Qd, the storage capacitor Cst, and the organic light emitting diode OLED can be changed.

The cross-sectional structure shown in FIG. 9 will be described in detail with reference to FIG. 10. However, the same description regarding the above-described constituent elements will be omitted.

As shown in FIG. 10, a pixel defining layer 360 is positioned on the passivation layer 180 and the pixel electrode 191. The pixel defining layer 360 includes an opening that exposes the pixel electrode 191. The pixel defining layer 360 may include an inorganic material, such as polyacrylics, polyimides, and the like.

An emission layer 370 is positioned in the opening of the pixel defining layer 360 over the pixel electrode 191, and a common electrode 270 is positioned on the emission layer 370. The pixel electrode 191, the emission layer 370, and the common electrode 270 form the organic light emitting diode OLED. The pixel electrode 191 may be an anode of the organic light emitting diode OLED, and the common electrode 270 may be a cathode of the organic light emitting diode OLED.

Light emitted from the emission layer 370 may be reflected several times, passed through the substrate 110, and then be emitted down through the substrate 110, or may be emitted above the substrate 110 without passing through the substrate 110.

Although not shown in the figures, an encapsulation layer may be formed on the common electrode 270 to protect the organic light emitting diode OLED.

Figure 11:
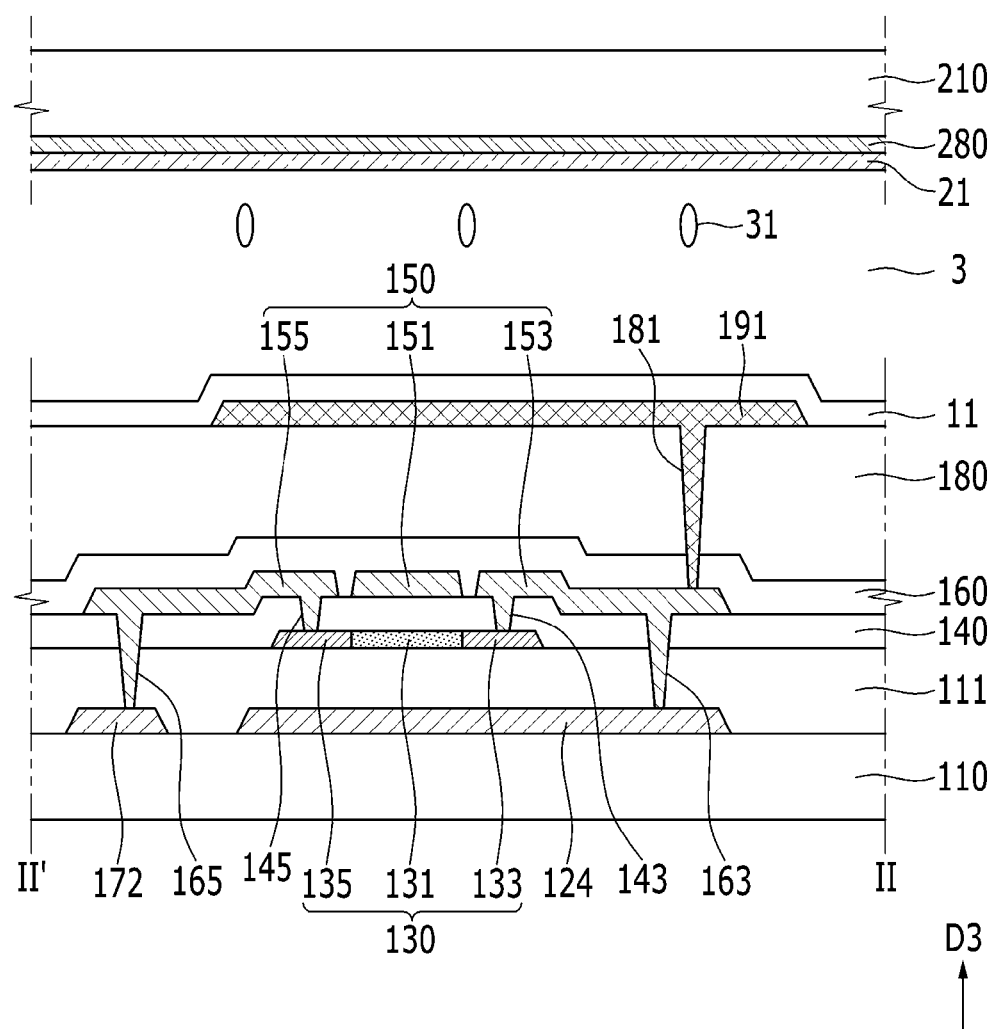
FIG. 11 is a cross-sectional view of a display device according to another exemplary embodiment.

Next, FIG. 11 is a cross-sectional view of a display device according to an exemplary embodiment.

The display device according to the present exemplary embodiment is a liquid crystal display (LCD), and may include the transistor according to the above-described exemplary embodiment. Here, the same description regarding to the above-described constituent elements will be omitted.

As shown in FIG. 11, a liquid crystal layer 3 including liquid crystal molecules 31 is positioned on the pixel electrode 191.

An insulation layer 210 encapsulating the liquid crystal layer 3 with the substrate 110 is positioned on the liquid crystal layer 3

The insulation layer 210 may be of a substrate type.

An opposed electrode 280 may be positioned under or over the insulation layer 210. The opposed electrode 280 may generate an electric field to the liquid crystal layer 3 with the pixel electrode 191, thereby controlling the direction of the liquid crystal molecules 31. However, the opposed electrode 280 may be positioned between the substrate 110 and the liquid crystal layer 3. The opposed electrode 280 may include a transparent conductive material such as ITO, IZO, and the like. For example, a common voltage may be applied to the opposed electrode 280.

Next, alignment layers 21 and 11 are respectively positioned between the liquid crystal layer 3 and the insulation layer 210, and between the liquid crystal layer 3 and the pixel electrode 191. The alignment layers 11 and 21 control the initial arrangement of the liquid crystal molecules 31 when no electric field is generated in the liquid crystal layer 3. The alignment layers 11 and 21 may be adjacent to the liquid crystal layer 3.

The display device according to the present exemplary embodiment may further include a backlight for supplying light as a light-receiving type of display device. The backlight may be positioned under the substrate 110.

In addition, the transistor display panel according to an exemplary embodiment may be included in various display devices.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A transistor display panel comprising:
a driving voltage line and a first electrode disposed on a substrate;
a semiconductor disposed on the substrate and overlapping the first electrode; and
an electrode layer overlapping the semiconductor, the electrode layer comprising a drain electrode, a gate electrode, and a source electrode;
wherein:
the semiconductor includes a source region, a drain region, and a channel region;
all areas of the source region, the drain region, and the channel region are disposed above and overlap the first electrode in a direction perpendicular to the substrate;
the first electrode and the semiconductor are connected through the source electrode; and
the first electrode is disposed between the substrate and the semiconductor.

2. The transistor display panel of claim 1, wherein the drain region and the driving voltage line are connected through the drain electrode.

3. The transistor display panel of claim 1, wherein the source region and the first electrode are connected through the source electrode.

4. The transistor display panel of claim 1, wherein the drain electrode, the gate electrode, and the source electrode are disposed in the same layer.

5. The transistor display panel of claim 1, wherein the first electrode and the driving voltage line are disposed in the same layer.

6. A transistor display panel comprising:
a driving voltage line and a first electrode disposed on a substrate;
a semiconductor disposed on the substrate and overlapping the first electrode; and
an electrode layer overlapping the semiconductor, the electrode layer comprising a drain electrode, a gate electrode, and a source electrode;
a first insulating layer covering the driving voltage line and the first electrode; and
a second insulating layer covering the semiconductor,
wherein:
the first electrode and the semiconductor are connected through the source electrode;
the first electrode is disposed between the substrate and the semiconductor;
the first insulating layer and the second insulating layer comprise a first contact hole connecting the first electrode and the source electrode and a second contact hole connecting the driving voltage line and the drain electrode; and
the second insulating layer comprises a third contact hole connecting the source region and the source electrode and a fourth contact hole connecting the drain region and the drain electrode.

7. The transistor display panel of claim 6, wherein the second insulating layer is disposed on an entire surface of the substrate.

8. A display device comprising:
a driving voltage line and a first electrode disposed on a substrate;
a semiconductor disposed on the substrate and overlapping the first electrode;
an electrode layer overlapping the semiconductor, the electrode layer comprising a drain electrode, a gate electrode, and a source electrode; and
a pixel electrode disposed on the electrode layer,
wherein:
the first electrode and the semiconductor are connected through the source electrode; and
each of the pixel electrode and the first electrode is connected with the semiconductor through the source electrode; and
the first electrode is disposed between the substrate and the semiconductor.

9. The display device of claim 8, further comprising:
a first capacitor electrode disposed on the substrate; and
a second capacitor electrode disposed on the first capacitor electrode,
wherein:
the first capacitor electrode is integrally connected with the first electrode; and
the second capacitor electrode is integrally connected with the gate electrode.

10. The display device of claim 8, wherein:
the semiconductor comprises a drain region, a channel, and a source region;
the drain region and the driving voltage line are connected through the drain electrode; and
the source region and the first electrode are connected through the source electrode.

11. The display device of claim 8, further comprising;
a first insulating layer covering the driving voltage line and the first electrode; and
a second insulating layer covering the semiconductor,
wherein:
the first insulating layer and the second insulating layer comprise a first contact hole connecting the first electrode and the source electrode and a second contact hole connecting the driving voltage line and the drain electrode; and
the second insulating layer comprises a third contact hole connecting the source region and the source electrode and a fourth contact hole connecting the drain region and the drain electrode.

* * * * *